US007745960B2

(12) United States Patent
Chen et al.

(10) Patent No.: US 7,745,960 B2
(45) Date of Patent: Jun. 29, 2010

(54) POWER SUPPLY CONTROL SIGNAL GENERATING CIRCUIT

(75) Inventors: Ying Chen, Shenzhen (CN); Jin-Liang Xiong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 378 days.

(21) Appl. No.: 11/958,396

(22) Filed: Dec. 18, 2007

(65) Prior Publication Data

US 2009/0055663 A1 Feb. 26, 2009

(30) Foreign Application Priority Data

Aug. 20, 2007 (CN) ........................ 2007 1 0201406

(51) Int. Cl.
*H01H 9/54* (2006.01)

(52) U.S. Cl. ....................... 307/140; 307/125; 307/130; 307/131; 363/49

(58) Field of Classification Search ................. 307/125, 307/130, 131, 140; 363/49
See application file for complete search history.

(56) References Cited

U.S. PATENT DOCUMENTS

| | | | | |
|---|---|---|---|---|
| 4,277,824 | A | 7/1981 | Alberkrack | |
| 4,398,098 | A * | 8/1983 | Minchey | 307/140 |
| 7,173,350 | B2 * | 2/2007 | Okitsu et al. | 307/140 |
| 7,215,044 | B2 * | 5/2007 | Mistry et al. | 307/147 |
| 7,288,857 | B2 * | 10/2007 | Bartholomew et al. | 307/140 |
| 2008/0037186 | A1 * | 2/2008 | Xiao et al. | 361/18 |
| 2008/0252281 | A1 * | 10/2008 | Yan et al. | 323/288 |
| 2008/0284377 | A1 * | 11/2008 | Chen et al. | 320/137 |

* cited by examiner

*Primary Examiner*—Jared J Fureman
*Assistant Examiner*—Hal I Kaplan
(74) *Attorney, Agent, or Firm*—Frank R. Niranjan

(57) ABSTRACT

A power supply control signal generating circuit includes a connector, a switch, a transistor, and an input-output (I/O) controller. The connector includes a first pin and a grounded second pin. The switch has two terminals respectively coupled to the first pin and the second pin of the connector. The transistor has its base coupled to the first pin of the connector and a power supply via a first resistor, its collector coupled to the power supply via a second resistor, and its emitter grounded. The I/O controller has an input terminal coupled to the collector of the transistor, and outputs a power supply control signal at the output terminal.

3 Claims, 1 Drawing Sheet

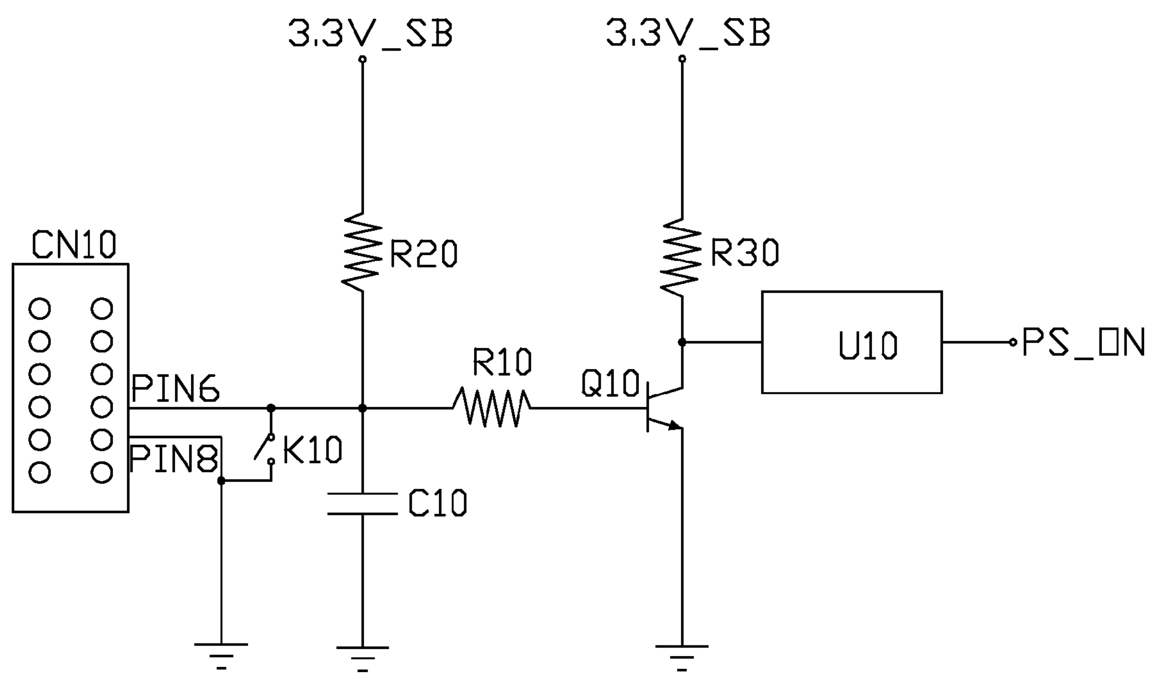
3.3V_SB
3.3V_SB
CN10
R20
R30
U10
PS_ON
PIN6
R10
Q10
PIN8
K10
C10

POWER SUPPLY CONTROL SIGNAL GENERATING CIRCUIT

BACKGROUND

1. Field of the Invention

The present invention relates to control signal generating circuits, and particularly to a power supply control signal generating circuit in a computer.

2. Description of Related Art

AT-style computer cases have a power button that is directly connected to the system computer power supply (PSU). The general configuration is a double-pole latching mains voltage switch with the four pins connected to wires from a four-core cable. The wires are either soldered to the power button (making it difficult to replace the power supply if it fails) or blade receptacles are used. An ATX power supply does not directly connect to the system power button, allowing the computer to be turned off via software. However, many ATX power supplies have a manual switch on the back to ensure the computer is truly off and no power is sent to the components. With this switch on, energy still flows to the components even when the computer appears to be "off." This is known as soft-off or standby and can be used for remote wake up through Wake-on-Ring or Wake-on-LAN, but is generally used to power on the computer through a front switch. When the front switch is pressed, a MOSFET on a motherboard of the computer turns off, and then an input-output (I/O) controller on the motherboard converts the signal output from the MOSFET to a power supply control signal Power Supply On (PS_ON). The power supply control signal is then transmitted to the ATX power supply to control output of direct current (DC) voltage. However, when the user presses the front switch, static electricity that may have accumulated in the user's body is transmitted to the gate of the MOSFET through the front switch. The MOSFET has high input impedance, so a lot of static electricity can accumulate at the gate of the MOSFET and ruin the MOSFET.

What is needed, therefore, is to provide a power supply control signal generating circuit which can eliminate static electricity at the gate of the MOSFET.

SUMMARY

An exemplary power supply control signal generating circuit includes a connector, a switch, a transistor, and an input-output (I/O) controller. The connector includes a first pin and a grounded second pin. The switch has two terminals respectively coupled to the first pin and the second pin of the connector. The transistor has its base coupled to the first pin of the connector and a power supply via a first resistor, its collector coupled to the power supply via a second resistor, and its emitter grounded. The I/O controller has an input terminal coupled to the collector of the transistor, and outputs a power supply control signal at the output terminal.

Other advantages and novel features of the present invention will become more apparent from the following detailed description of preferred embodiment when taken in conjunction with the accompanying drawing, in which:

BRIEF DESCRIPTION OF THE DRAWING

The drawing is a circuit diagram of an embodiment of a power supply control signal generating circuit in accordance with the present invention.

DETAILED DESCRIPTION

Referring to the drawing, a power supply control signal generating circuit in accordance with an embodiment of the present invention is configured to provide a power supply control signal Power Supply On (PS_ON) to an ATX power supply in a computer. The power supply control signal generating circuit includes a connector CN10, a switch K10, a transistor Q10, resistors R10, R20, R30, a capacitor C10, an input-output (I/O) controller U10, and a power supply 3.3V_SB.

The connector CN10 includes two pins PIN6, PIN8, and PIN8 is grounded. The switch K10 includes two terminals respectively coupled to PIN6, PIN8. The base of the transistor Q10 is coupled to PIN6 via the resistor R10, and is coupled to the input voltage 3.3V_SB via the resistors R10, R20. The collector of the transistor Q10 is coupled to the power supply 3.3V_SB via the resistor R30. The emitter of the transistor Q10 is grounded. The PIN6 is grounded via the capacitor C10. The I/O controller U10 has an input terminal coupled to the collector of the transistor Q10, and outputs the power supply control signal PS_ON at an output terminal. In this embodiment, the connector CN10 is disposed on a motherboard of the computer. The switch K10 is disposed on a front panel of the computer and controlled by a button.

When the switch K10 is off, the power supply 3.3V_SB provides voltage to the base of the transistor Q10 through the resistors R20, R10. The transistor Q10 turns on, and outputs a low voltage level signal at the collector. The I/O controller U10 receives the low voltage level signal from the collector of the transistor Q10, and converts the low voltage level signal to a high voltage level power supply control signal PS_ON. The high voltage level power supply control signal PS_ON is then transmitted to the ATX power supply, the ATX power supply does not output direct current (DC) voltage. When the button on the front panel is pressed, the switch K10 is on. PIN6 is grounded and the voltage level at the base of the transistor Q10 is low, the transistor Q10 turns off and outputs a high voltage level signal at the collector. The I/O controller U10 converts the high voltage level signal to a low voltage level power supply control signal PS_ON. The low voltage level power supply control signal PS_ON is then transmitted to the ATX power supply, the ATX power supply outputs DC voltage.

When the user presses the button on the front panel of the computer, static electricity in the user's body is dissipated to ground via the resistor R10. The transistor Q10 has low input impedance, so little static electricity is accumulated at the base of the transistor Q10. Therefore damage to the transistor Q10 can be avoided.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A power supply control signal generating circuit, comprising:

a connector having a first pin and a grounded second pin;

a switch having two terminals respectively coupled to the first pin and the second pin of the connector;

a transistor having its base coupled to the first pin of the connector and a power supply via a first resistor, its collector coupled to the power supply via a second resistor, and its emitter grounded; and an input-output (I/O) controller having an input terminal coupled to the collector of the transistor, and outputting a power supply control signal at an output terminal.

2. The power supply control signal generating circuit as claimed in claim 1, further comprising a third resistor, the base of the transistor coupled to the power supply via the first resistor and the third resistor.

3. The power supply control signal generating circuit as claimed in claim 1, further comprising a capacitor for wave filtering, the first pin of the connector being grounded via the capacitor.

* * * * *